United States Patent
Kitano et al.

(10) Patent No.: US 6,933,015 B2
(45) Date of Patent: Aug. 23, 2005

(54) METHOD OF FORMING FILM

(75) Inventors: Takahiro Kitano, Kikuchi-gun (JP);
Shinji Kobayashi, Kikuchi-gun (JP);
Yukihiko Esaki, Kikuchi-gun (JP);
Masateru Morikawa, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 186 days.

(21) Appl. No.: 10/361,689

(22) Filed: Feb. 11, 2003

(65) Prior Publication Data

US 2003/0118740 A1 Jun. 26, 2003

Related U.S. Application Data

(62) Division of application No. 09/712,179, filed on Nov. 15, 2000, now Pat. No. 6,537,373.

(30) Foreign Application Priority Data

Nov. 18, 1999 (JP) .............................. 11-328800

(51) Int. Cl.$^7$ ................................ B05D 3/00
(52) U.S. Cl. ...................... 427/294; 427/421
(58) Field of Search .................. 427/294, 421

(56) References Cited

U.S. PATENT DOCUMENTS

| 5,658,615 A | 8/1997 | Hasebe et al. |
| 5,800,867 A | 9/1998 | Matsunaga et al. |
| 5,952,050 A | 9/1999 | Doan |

FOREIGN PATENT DOCUMENTS

| JP | 12-77326 | 3/2000 |
| JP | 12-188251 | 7/2000 |

*Primary Examiner*—Bernard Pianalto
(74) *Attorney, Agent, or Firm*—Oblon, Spivak, McClelland, Maier & Neustadt, P.C.

(57) ABSTRACT

A method of forming a film of a coating solution on a substrate includes steps of moving a coating solution discharge member relative to a substrate while a coating solution is being discharged from the coating solution discharge member to the surface of the substrate, and changing a discharge direction of the coating solution to an outer peripheral portion of the substrate to make the amount of application to the outer peripheral portion smaller than that to other portions. This can reduce the amount of application to the outer peripheral portion of the substrate, thereby making it possible to restrain protuberance of the coating solution at the outer peripheral portion of the substrate caused by surface tension. Consequently, a coating film which is uniform also at the outer peripheral portion on the substrate is formed.

12 Claims, 15 Drawing Sheets

Without Suction Nozzle

With Suction Nozzle

METHOD OF FORMING FILM

CROSS-REFERENCE TO RELATED APPLICATIONS

This application is based upon and claims the benefit of priority from the prior Japanese Patent Application No. 11-328800, filed Nov. 18, 1999, and is a divisional application of U.S. patent application Ser. No. 09/712,179, filed Nov. 15, 2000, now U.S. Pat. No. 6,537,373 the entire contents of which are incorporated herein by reference.

BACKGROUND OF THE INVENTION

The present invention relates to a method of forming a film on a substrate and an apparatus thereof.

In a photolithography process in the semiconductor device fabrication processes, for example, resist coating treatment in which a resist solution is applied to the surface of a wafer to form a resist film, exposure processing in which the wafer is exposed in a pattern, developing treatment in which development is performed for the exposed wafer, and the like are performed to form a predetermined circuit pattern on the wafer.

At present, in the above-described resist coating treatment, a spin coating method is in the mainstream as a method of applying the resist solution. According to the spin coating method, the resist solution is discharged to the center of the wafer and the wafer is rotated. This allows the resist solution applied on the wafer to spread by centrifugal force, whereby a uniform resist film can be formed over the entire face of the wafer.

However, in the spin coating method, since the wafer is rotated at high speed, a large amount of resist solution scatters from the peripheral portion of the wafer, resulting in a big waste of resist solution. Further, the apparatus is contaminated by the scatter of the resist solution, bringing about harmful effects such as a need for cleaning frequently.

Hence, instead of the spin coating method in which the wafer is rotated, a method, in which a nozzle for discharging the resist solution and the wafer move relative to each other to apply the resist solution, for example, evenly on the wafer in lattice form, is conceivable.

However, in the case in which the resist solution is applied in the manner of the so-called single stroke, it is feared that the resist solution applied at the peripheral portion of the wafer protrudes by surface tension, with the result that a resist film is not uniformly formed. When exposure is performed with the resist film protruding at the peripheral portion, the peripheral portion becomes a defective portion which can not be used as products, whereby yields correspondingly decrease.

BRIEF SUMMARY OF THE INVENTION

The present invention is made in consideration of the above points and its object is to provide a film forming method, which basically employs a method of forming a film on a substrate by discharging a coating solution while a coating solution discharge member such as the aforesaid nozzle and a substrate such as a wafer move relative to each other, in which a uniform resist film is formed also at an outer peripheral portion of the substrate, and a film forming apparatus having the above functions.

In the consideration of the above object, the method of the present invention is a method of forming a film of a coating solution on a substrate through the use of a coating solution discharge member, comprising the steps of: moving the coating solution discharge member relative to the substrate while the coating solution is being discharged from the coating solution discharge member to the surface of the substrate; and changing a discharge direction of the coating solution to an outer peripheral portion of the substrate to make the amount of application to the outer peripheral portion smaller than that to other portions.

Further, the apparatus of the present invention is a film forming apparatus for a substrate including a coating solution discharge member for discharging a coating solution to the substrate, comprising: coating solution suction means for sucking the coating solution discharged from the coating solution discharge member to an outer peripheral portion of the substrate before the coating solution reaches the substrate, the coating solution discharge member being movable relative to the substrate while discharging the coating solution to the surface of the substrate.

The apparatus of the present invention may not include the suction means, but the coating solution discharge member may be arranged such that a discharge direction of the coating solution to the outer peripheral portion of the substrate is changeable.

The apparatus of the present invention may have gas supply means for blowing a predetermined gas to the coating solution discharged from the coating solution discharge member to the outer peripheral portion of the substrate before the coating solution reaches the substrate in place of the suction means.

According to the present invention, it is possible to change the discharge direction of the coating solution to the outer peripheral portion of the substrate, thereby reducing the amount of application to the outer peripheral portion of the substrate, so that it is possible to restrain protuberance of the coating solution at the outer peripheral portion of the substrate caused by surface tension. Consequently, a uniform coating film is formed also at the outer peripheral portion on the substrate, and thus a region on the substrate which can be used as products is increased in area to improve yields.

The discharge direction of the coating solution is changed only when the coating solution discharge member moves from the inside to the outside of the substrate to thereby cross the outer peripheral portion of the substrate or when it reversely moves from the outside to the inside of the substrate to thereby cross the outer peripheral portion of the substrate, whereby the discharge is performed, as a result, only when the coating solution discharge member moves in one direction, so that the amount of application to the outer peripheral portion of the substrate is reduced to half. Accordingly, protuberance at the outer peripheral portion is restrained to thereby improve yields. Moreover, the amount of application can be reduced correspondingly, resulting in reduced cost.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
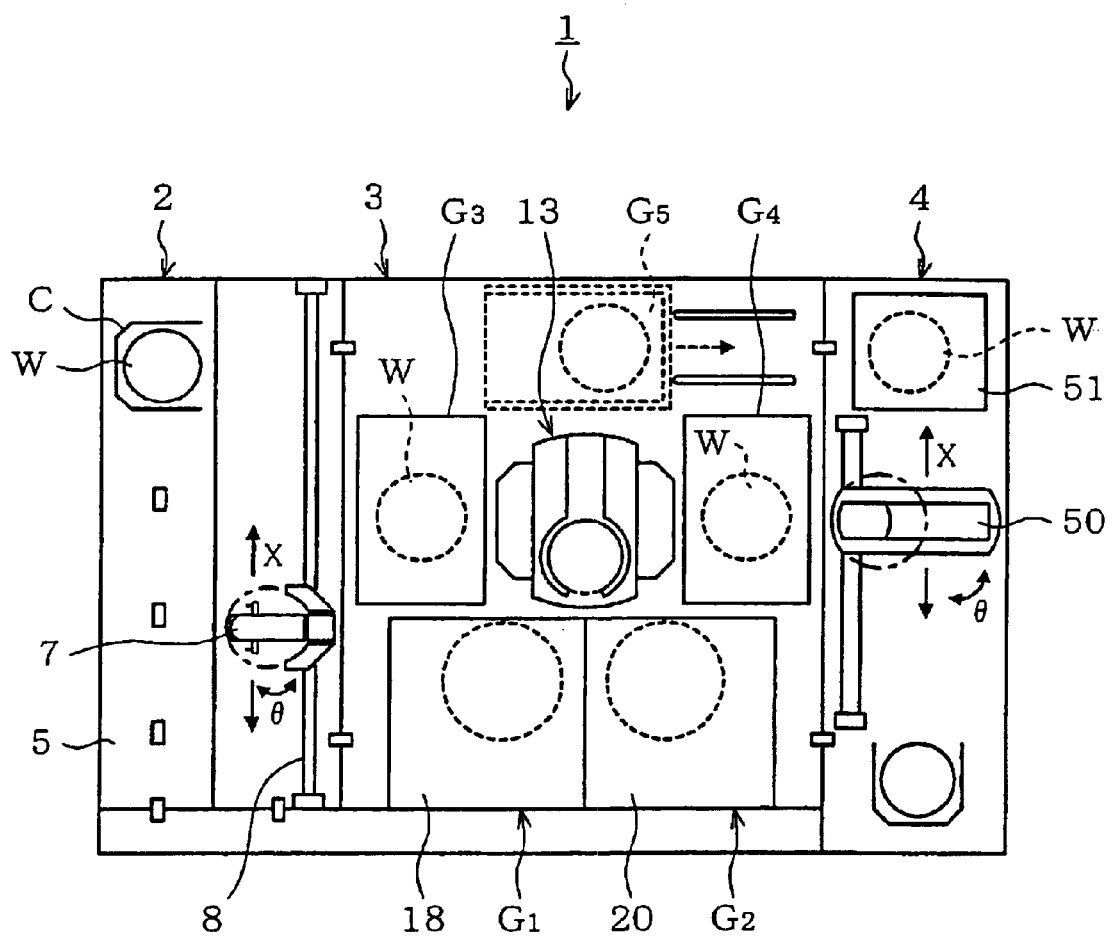
FIG. 1 is a plan view showing an appearance of a coating and developing system including an apparatus according to an embodiment.
Figure 2:
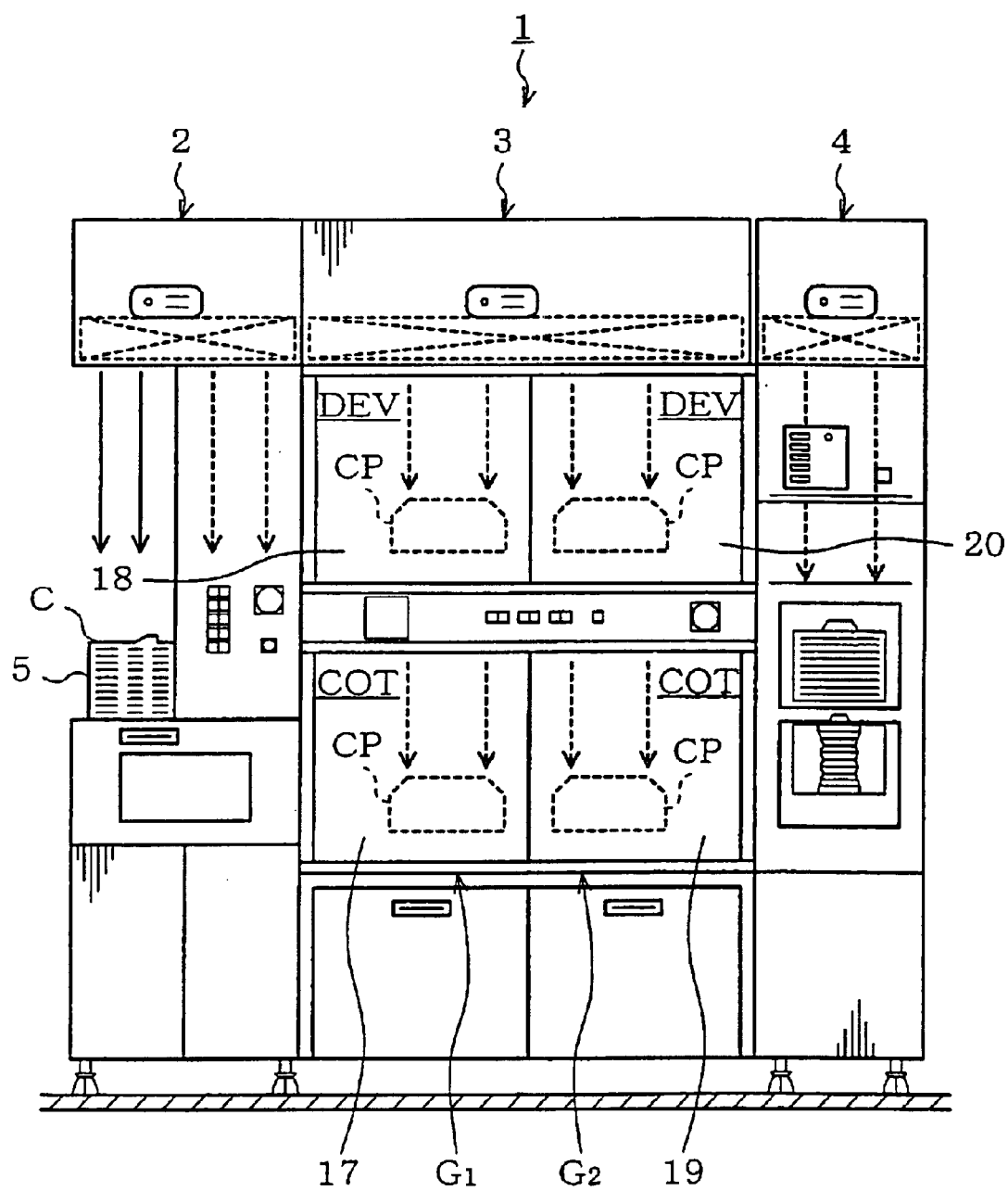
FIG. 2 is a front view of the coating and developing system in FIG. 1.
Figure 3:
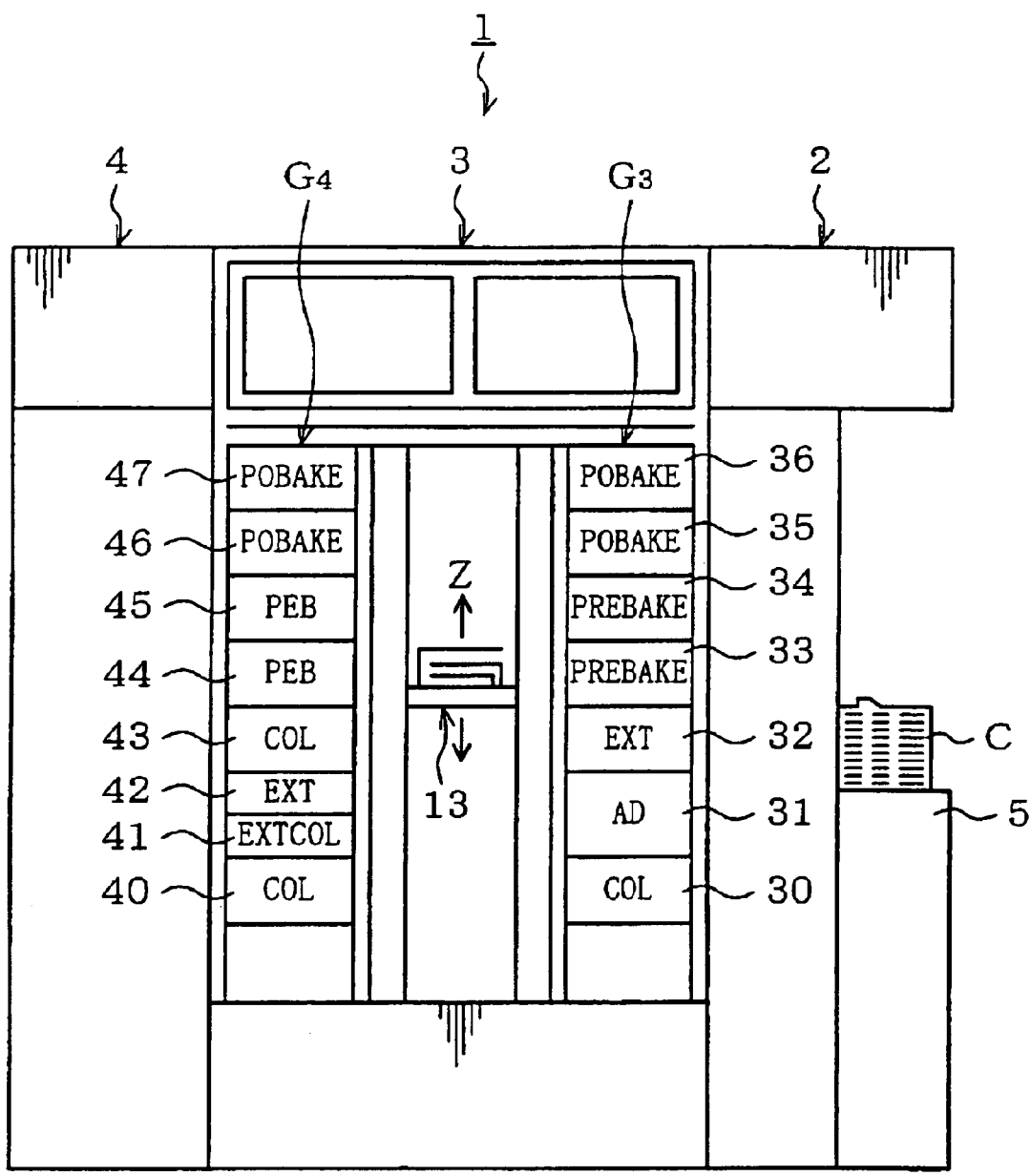
FIG. 3 is a rear view of the coating and developing system in FIG. 1.

Hereinafter, preferable embodiments of the present invention will be described. FIG. 1 is a plan view of a coating and developing system 1 including a resist coating unit according to an embodiment, FIG. 2 is a front view of the coating and developing system 1, and FIG. 3 is a rear view of the coating and developing system 1.

The coating and developing system 1 has a configuration, as shown in FIG. 1, in which a cassette station 2 for carrying, for example, 25 wafers W, as a unit of cassette, from/to the outside into/out of the coating and developing system 1 and carrying the wafer W into/out of a cassette C, a processing station 3 in which various kinds of processing and treatment units each for performing predetermined processing or treatment for the wafers W one by one in coating and developing steps are multi-tiered, and an interface section 4 for delivering the wafer W to/from a light-exposure apparatus (not shown) provided adjacent to the processing station 3 are integrally connected.

In the cassette station 2, a plurality of cassettes C can be mounted at predetermined positions on a cassette mounting table 5 which is a mounting portion in a line in an X-direction (a vertical direction in FIG. 1). A wafer carrier 7 transportable in the direction of arrangement of the cassettes (the X-direction) and in the direction of arrangement of the wafers W housed in the cassette C (a Z-direction; a vertical direction) is provided to be movable along a carrier guide 8 so as to selectively get access to each cassette C.

The wafer carrier 7 includes an alignment function of aligning the wafer W. The wafer carrier 7 is configured to get access also to an extension unit 32 included in a third processing unit group G3 on the processing station 3 side as described later.

In the processing station 3, a main carrier unit 13 is provided at the central portion thereof, and various kinds of processing and treatment units are multi-tiered around the main carrier unit 13 to form processing unit groups. In the coating and developing system 1, four processing unit groups G1, G2, G3, and G4 are arranged, the first and second processing unit groups G1 and G2 are disposed on the front side of the coating and developing system 1, the third processing unit group G3 is disposed adjacent to the cassette station 2, and the fourth processing unit group G4 is disposed adjacent to the interface section 4. Further, a fifth processing unit group G5 shown by a broken line can be additionally disposed on the rear side as an option.

In the first processing unit group G1, for example, as shown in FIG. 2, a resist coating unit 17 according to this embodiment and a developing unit 18 for supplying a developing solution to the wafer W to thereby treat it are two-tiered in order from the bottom. In the second processing unit group G2, a resist coating unit 19 and a developing unit 20 are similarly two-tiered in order from the bottom.

In the third processing unit group G3, for example, as shown in FIG. 3, a cooling unit 30 for cooling for the wafer W, an adhesion unit 31 for enhancing fixedness between a resist solution and the wafer W, an extension unit 32 for allowing the wafer to wait therein, prebaking units 33 and 34 each for evaporating a solvent in the resist solution, postbaking units 35 and 36 each for performing heat treatment after developing treatment, and the like are, for example, seven-tiered in order from the bottom.

In the fourth processing unit group G4, for example, a cooling unit 40, an extension and cooling unit 41 for allowing the wafer W mounted thereon to cool by itself, an extension unit 42, a cooling unit 43, post-exposure baking units 44 and 45 each for performing heat treatment after exposure processing, postbaking units 46 and 47, and the like are, for example, eight-tiered in order from the bottom.

A wafer carrier 50 is provided at the central portion of the interface section 4. The wafer carrier 50 is configured to be movable in the X-direction (the vertical direction in FIG. 1) and in the Z-direction (the vertical direction) and rotatable in a θ-direction (a direction of rotation around a Z-axis) so as to get access to the extension and cooling unit 41 and the extension unit 42 included in the fourth processing unit group G4, a peripheral light-exposure unit 51, and the light-exposure apparatus (not shown).

Figure 4:
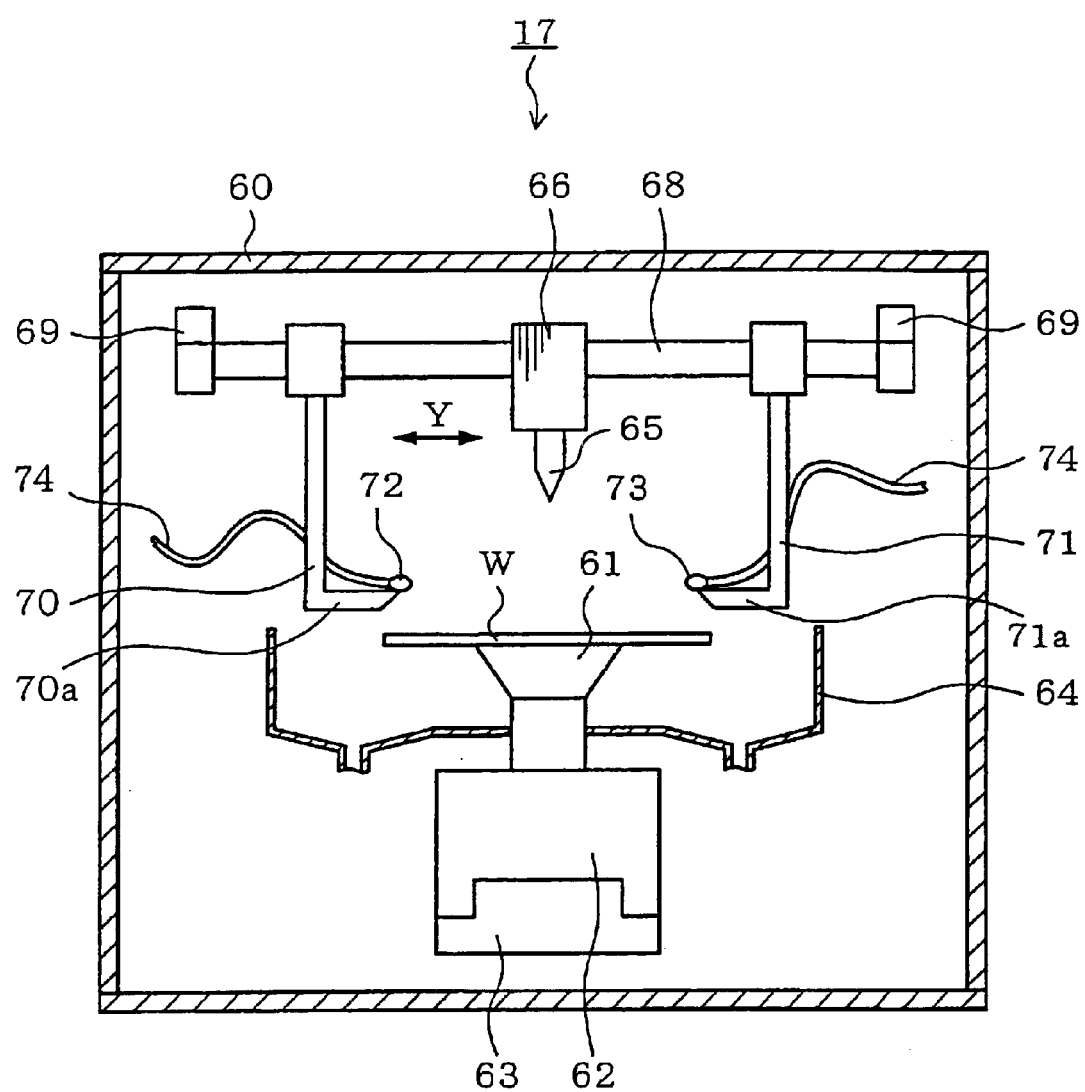
FIG. 4 is an explanatory view of a vertical cross section of a resist coating unit according to a first embodiment.
Figure 5:
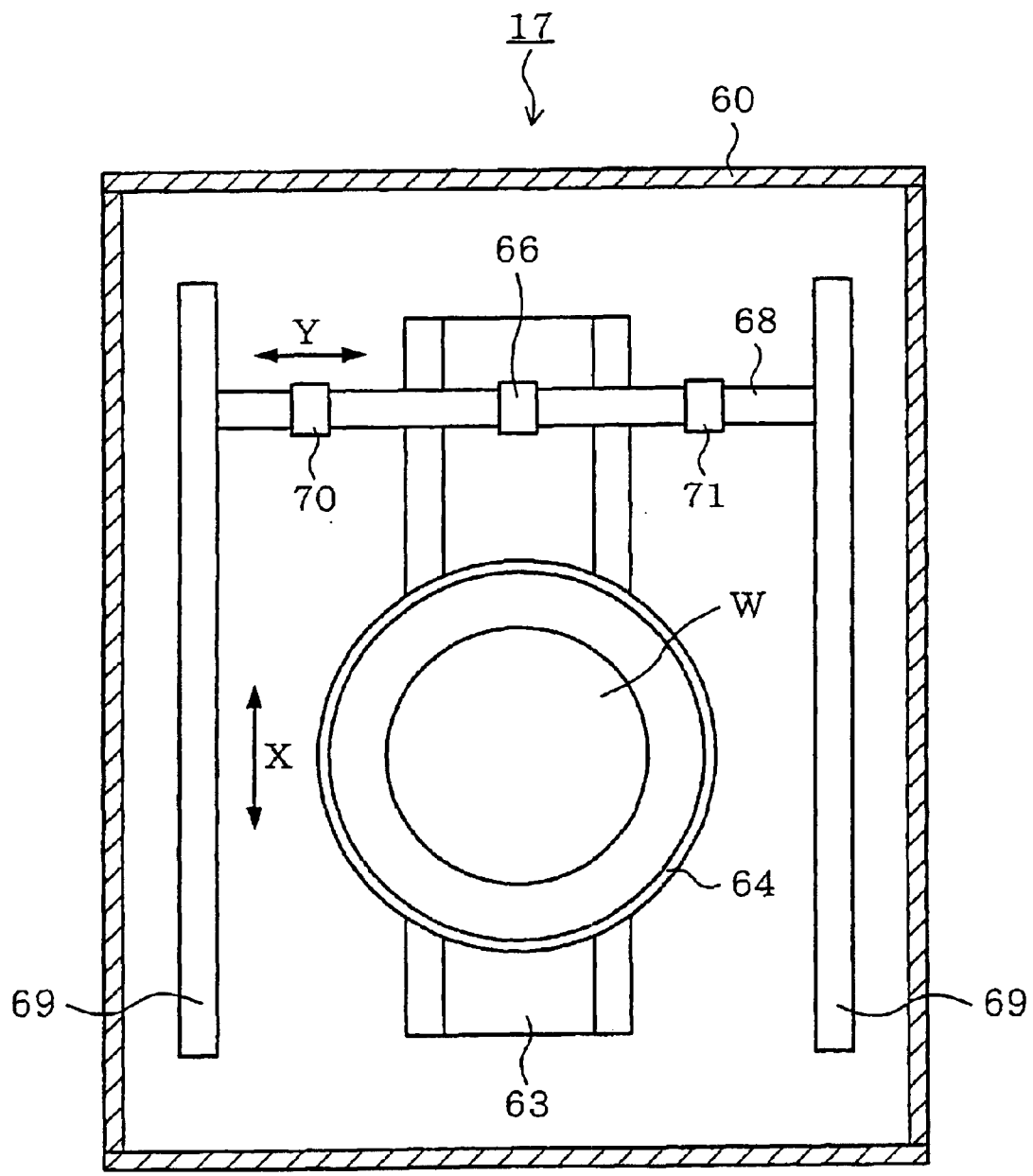
FIG. 5 is an explanatory view of a horizontal cross section of the resist coating unit according to the first embodiment.

Next, the resist coating unit 17 will be explained in detail. As shown in FIG. 4 and FIG. 5, a mounting table 61 for holding the wafer W under processing, for example, by sucking it, is provided in a casing 60. The mounting table 61 is vertically driven and further rotatable by means of a drive mechanism 62. Moreover, an orientation flat portion or a notch portion of the wafer w is detected by an optical sensor (not shown), and the wafer w is rotated to a predetermined position, whereby the wafer W can be aligned. The drive mechanism 62 itself is movable on a rail 63 disposed in an X-direction (a vertical direction in the drawing) as shown in FIG. 5, so that the motion in the X-direction of the mounting table 61 is controlled by a controller (not shown). It should be noted that a cup 64, which surrounds the side and the lower part of the mounting table 61, for collecting the resist solution dropped from the wafer W is attached to the mounting table 61.

As shown in FIG. 4, a nozzle 65 as a coating solution discharge member for supplying the resist solution to the wafer W is provided above the mounting table 61. The nozzle 65 is held by a holding member 66, and the holding member 66 is movable on a rail 68 disposed in a Y-direction (the lateral direction in the drawing). The rail 68 is provided to be movable in the X-direction on two rails 69 arranged in the X-direction along both side walls of the casing 60. The motions of the rail 68 and the holding member 66 are controlled by the controller (not shown). Accordingly, the nozzle 65, of which the speed, the timing of motion, and the like are controlled by the controller (not shown), is movable in the X- and Y-directions.

Further, two mask members 70 and 71 each for preventing the resist solution from dropping off the wafer W are hung from the aforesaid rail 68 to be individually movable with the nozzle 65 therebetween. The two mask members 70 and 71, which extend downward from the rail 68 and bend inward to face each other at positions upper than the wafer W mounted on the mounting table 61, include horizontal portions 70a and 71a respectively. The horizontal portions 70a and 71a are made recessed form in cross section to receive the dropped resist solution so as to prevent the resist solution from scattering threreabout.

Moreover, the two mask members 70 and 71 are controlled in movement on the rail 68 so as to be always located above both end portions of the wafer W with movement of the mounting table 61 with the wafer W mounted thereon in the X-direction. Accordingly, the mask members 70 and 71 are located above both end portions of the wafer W on the same X coordinate with the nozzle 65 to block and receive the resist solution discharged from the nozzle 65 to the outside of the wafer W at the horizontal portions 70a and 71a, thereby preventing contamination inside the casing.

Figure 6:
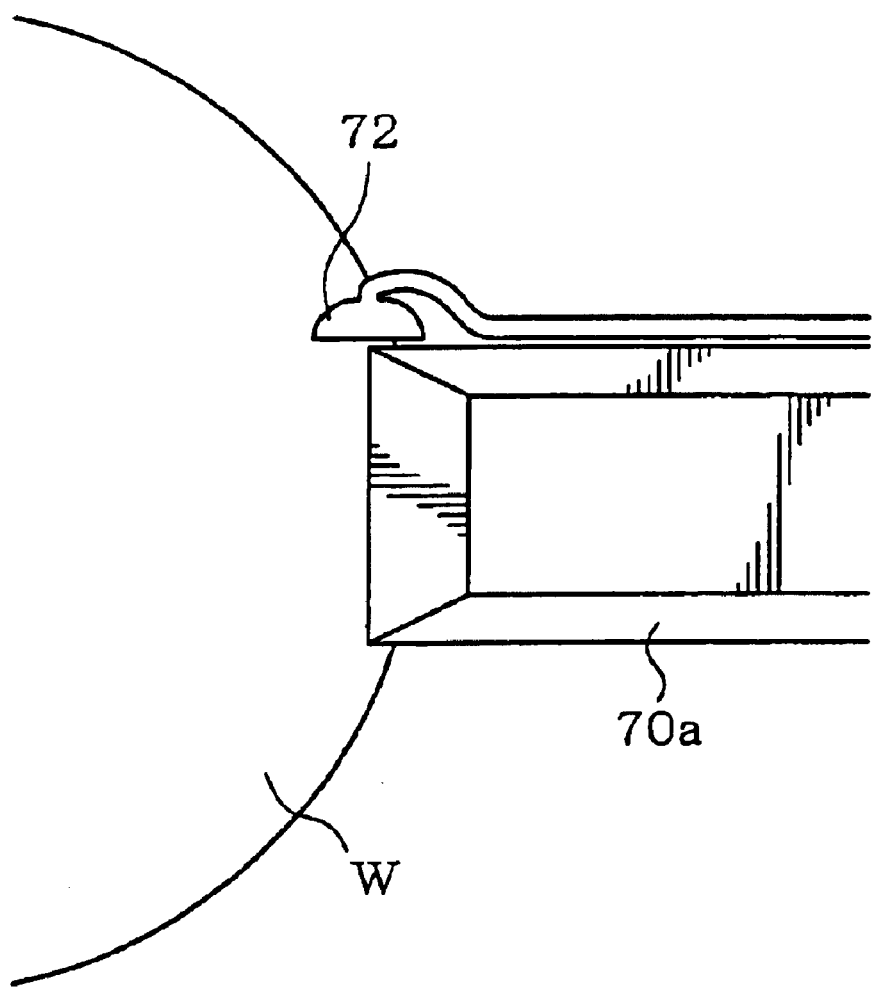
FIG. 6 is an explanatory view showing arrangement of a suction nozzle.

On the side faces of the horizontal portions 70a and 71a of the aforesaid two mask members 70 and 71, suction nozzles 72 and 73 each for sucking the resist solution discharged from the nozzle 65 to the peripheral portion of the wafer W are securely provided respectively as shown in FIG. 6. The suction nozzles 72 and 73 are slightly inside the tips of the horizontal portions 70a and 71a of the mask members 70 and 71 in the range of 0.1 mm to 10 mm, and preferably, 1 mm to 5 mm, and the directions thereof are set so that they can suck the resist solution discharged to a thickness of, for example, about 1 mm. Accordingly, the suction nozzles 72 and 73 move in the X- and Y-directions with the mask members 70 and 71, suck the resist solution discharged from the nozzle 65 at predetermined timing described later, and drain it through drain pipes 74.

The aforesaid nozzles 72 and 73 are securely provided on the side faces of the mask members 70 and 71, but they may be secured on the nozzle 65 side and suck the resist solution immediately after discharged from the nozzle 65. However, it is preferable to secure the suction nozzles 72 and 73 on the mask members 70 and 71 from the viewpoint of waste of power consumption since a heavy load is imposed on the drive mechanism of the nozzle 65 when the suction nozzles 72 and 73 are attached to the nozzle 65 which is forced to move at high speed. Alternatively, the suction nozzles 72 and 73 may be independently hung from the rail 68 to suck the resist solution discharged from the nozzle 65.

Next, the process of the wafer W in the resist coating unit 17 configured as above will be explained with a series of processes of the coating and developing treatment.

First, the wafer carrier 7 takes one unprocessed wafer W out of the cassette C and carries it into the adhesion unit 31 included in the third processing unit group G3. The wafer W coated with an adhesion reinforcing agent such as HMDS in the adhesion unit 31 is carried to the cooling unit 30 by the main carrier unit 13 and cooled to a predetermined temperature. Thereafter, the wafer W is carried to the resist coating unit 17 or 19 according to this embodiment.

Next, the action of the wafer W in the resist coating unit 17 will be explained in detail. First, the wafer W for which the prior treatments have been completed is carried into the resist coating unit 17 by the main carrier unit 13. Then, the wafer W is suction-held by the mounting table 61, which has previously been raised by the drive mechanism 62 and waited, and lowered by the drive mechanism 62 to stop at a predetermined position in the cup 64. Thereafter, the wafer W is rotated by the drive mechanism 62 to detect the notch portion of the wafer W by the optical sensor (not shown) to align the wafer W at a predetermined position.

Figure 7:
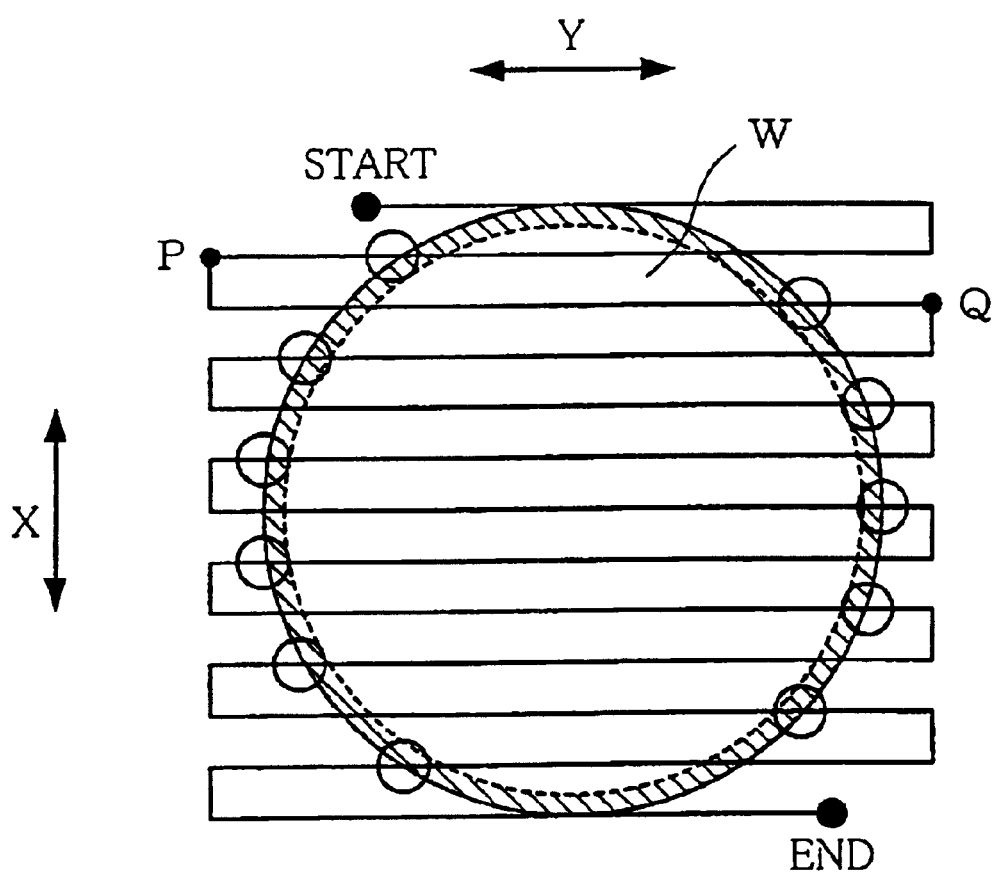
FIG. 7 is an explanatory view showing a coating path of a resist solution in the resist coating unit according to the first embodiment.

The wafer W for which alignment has been completed is moved on the rail 63 to a predetermined coating start position with movement of the drive mechanism 62 by means of the controller (not shown). At this time, for example, the nozzle 65 moves to the START point and waits there as shown in FIG. 7. Meanwhile, the nozzle 65 for discharging the resist solution normally moves along the rail 68 only in the Y-direction and waits at a predetermined position, and moves in the X-direction when the recipe for the wafer W is changed.

Thereafter, when the application of the resist solution to the wafer W is started, the nozzle 65 moves at a predetermined speed along the rail 68 extending in the Y-direction while applying a constant amount of the resist solution (for example, an amount of the discharged solution being 10 $\mu$m to 200 $\mu$m in diameter) onto the wafer W. When the nozzle 65 crosses the peripheral portion of the wafer W to reach a position above the mask member 70, it temporarily stops. The wafer W is sent in the X-direction by the movement of the drive mechanism 62 by means of the controller (not shown) in this state, whereby the wafer W is slid by a predetermined distance. At this time, for example, the mask member 70 is moved in the Y-direction so that the tip of the horizontal portion 70a thereof is always located above the wafer W slightly inside the end portion of the wafer W. Then, the resist solution is discharged while the nozzle 65 is again moved in the reverse direction. As has been described, the nozzle 65 is temporarily stopped at turn end portions while reciprocating, and the wafer W is intermittently moved in the X-direction during the stop, whereby the resist solution is applied on the entire face of the wafer W as shown in FIG. 7.

Figure 8:
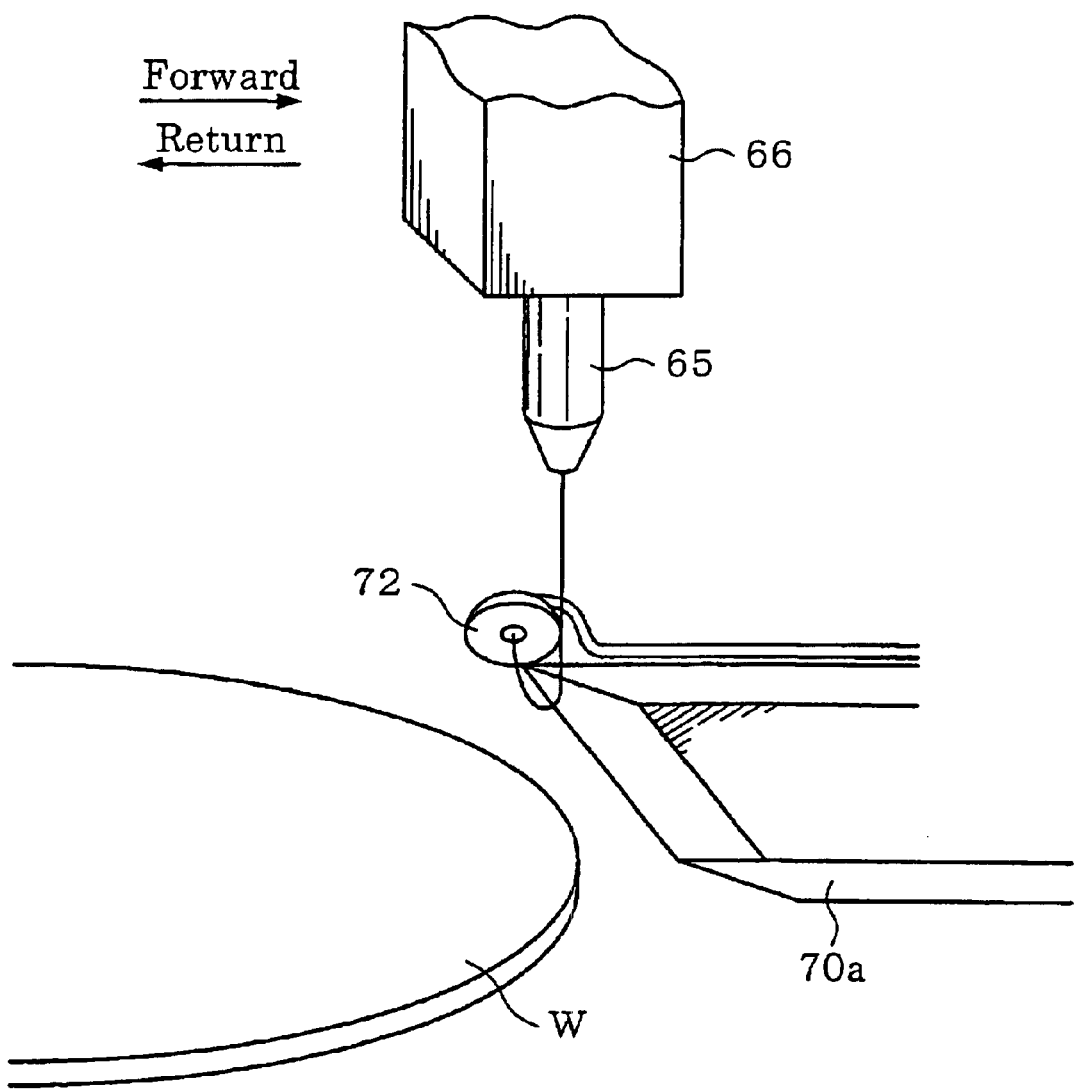
FIG. 8 is an explanatory view showing a state in which the resist solution discharged from a nozzle is sucked by the suction nozzle.

Further, during the above-described reciprocating movement, the resist solution discharged from the nozzle 65 is sucked by the suction nozzles 72 and 73 on the side faces of the mask members 70 and 71 when the nozzle 65 passes above the peripheral portions of the wafer W as shown in FIG. 8 to decrease the amount of the resist solution applied to the peripheral portion of the wafer W.

For example, the resist solution is sucked by the suction nozzle 72 when the nozzle 65 moves from the inside to the outside of the wafer W to pass its peripheral portion (this is referred to as "a forward path"). Then, the fact that the nozzle 65 has stopped at a predetermined position P (shown in FIG. 7) above the mask member 70 is regarded as a trigger to turn the suction of the suction nozzle 72 OFF and the suction nozzle 73 on the opposite side ON instead. Accordingly, when the nozzle 65 turns and moves from the outside to the inside of the wafer W to pass its peripheral portion (this is referred to as "a return path"), the resist solution is not sucked to be discharged as it is since the suction nozzle 72 is OFF. Therefore, the amount of application to the peripheral portion of the wafer W is reduced to half as compared with that in the case in which the resist solution is discharged on both the forward path and the return path. On the other hand, when the nozzle 65 has reached a predetermined position Q (shown in FIG. 7) which is on the other side of the wafer W to stop, the stop of the nozzle 65 is regarded as a trigger to turn the suction nozzle 73 OFF and the suction nozzle 72 ON this time. Consequently, the resist solution is sucked also at the peripheral portion of the wafer W on the mask member 71 side only on the forward path, whereby the amount of application is reduced to half. The points where the suction operations are performed are shown here by circular marks in FIG. 7.

It is also suitable that the aforesaid ON and OFF of the suction nozzles 72 and 73 are reversed so that the resist solution is sucked only on the aforesaid return path and discharged on the forward path. When one of the two suction nozzles 72 and 73 is ON, the other is turned OFF as described above, whereby the suction operation of the resist solution can be carried out through the use of an exceedingly simple controller circuit, and additionally a low-cost controller circuit can be used, resulting in reduced cost. The resist solution sucked by the suction nozzles 72 and 73 passes through the drain pipes 74 to be drained to the outside of the resist coating unit 17. As a result, the resist solution never scatters thereabout.

Figure 9:
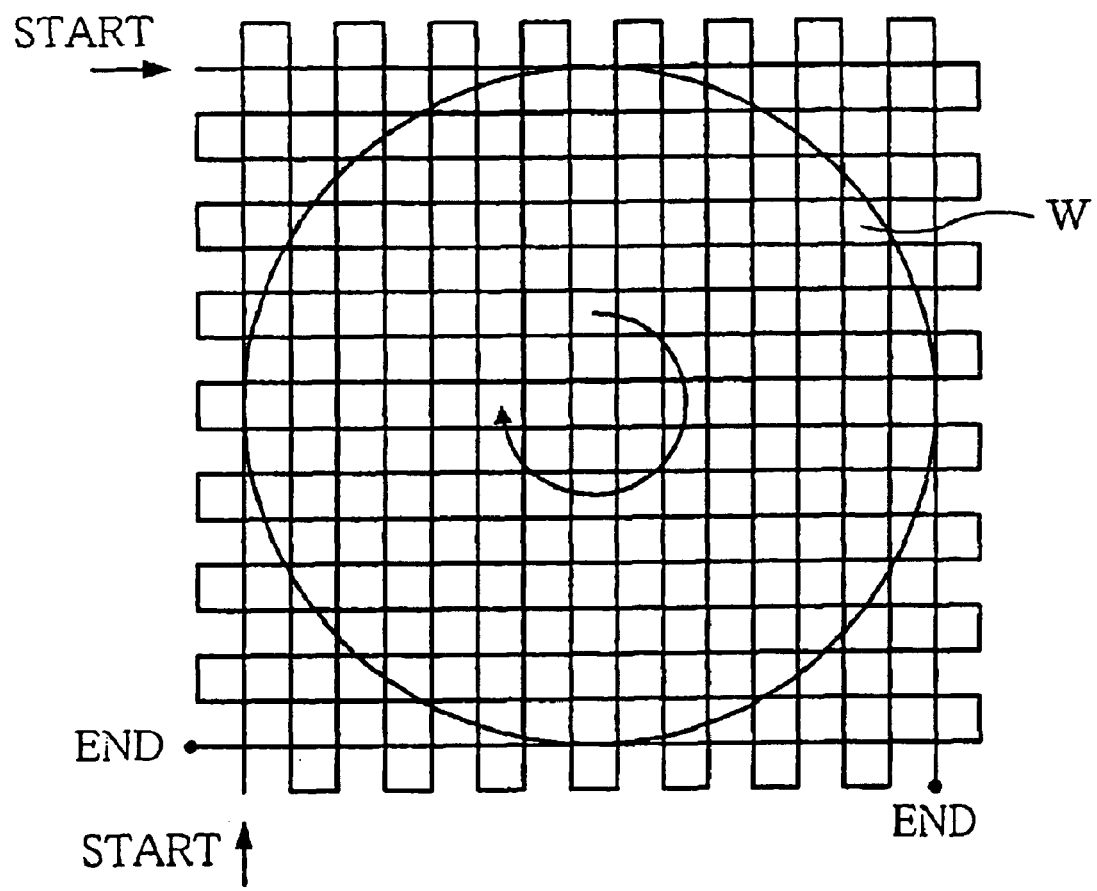
FIG. 9 is an explanatory view showing another example of the resist solution coating path.

As for the coating path of the resist solution, the wafer W is rotated, for example, 90 degrees after the application is performed through the aforesaid path as shown in FIG. 9 so that the resist solution may be applied twice. Also in this case, the amount of application to the peripheral portion of the wafer W is adjusted by the suction nozzle 72 or 73 as described above. In this way, it is also possible to apply the resist solution in the so-called lattice form.

Figure 10:
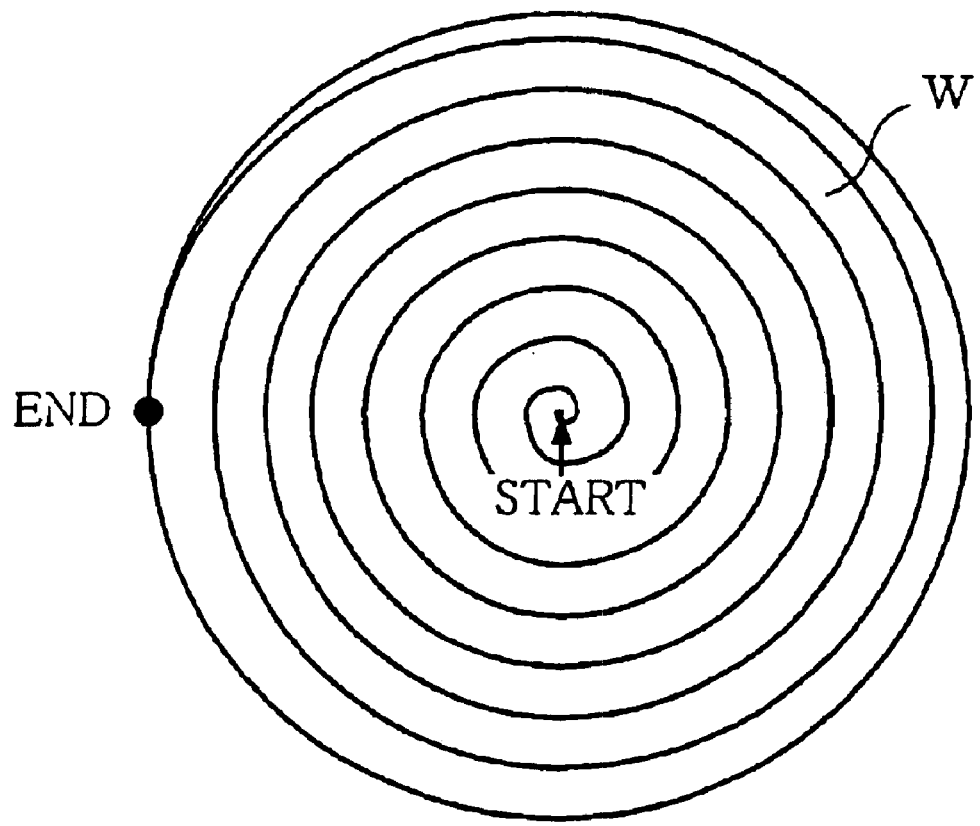
FIG. 10 is an explanatory view showing still another example of the resist solution coating path.

Alternatively, the path may be made spiral form as shown in FIG. 10. In this case, the nozzle 65 is moved in the X-direction from the center of the wafer W while the wafer W is rotated at a low speed (for example, 20 rpm to 30 rpm), for example, by the drive mechanism 62 to thereby perform the application. Also in this case, when the application onto the wafer W proceeds and the nozzle 65 reaches a position above the peripheral portion of the wafer W, the discharged resist solution is sucked by the suction nozzle 72 or 73 to reduce the amount of application to the peripheral portion of the wafer W. In this case, if control is performed such that the suction amount is gradually increased with the suction nozzle 72 or 73 getting closer to the peripheral portion of the wafer W, uniformity is improved.

Thereafter, the wafer W for which the application of the resist solution has been completed is raised by the drive mechanism 62 similarly to the time of carrying in, and is received by the main carrier unit 13. Subsequently, the wafer W is carried to the prebaking unit 33 or 34 by the main carrier unit 13 to be dried. Thereafter, a series of predetermined processing and treatments such as exposure processing, developing treatment, and the like is performed in the processing and treatment units, thereby completing the coating and developing treatment.

Figure 11A:
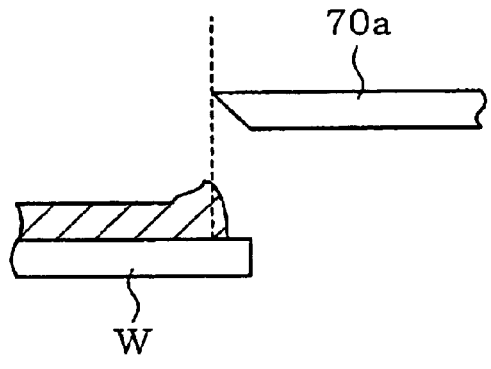
FIGS. 11A and 11B are explanatory views showing the difference in resist films due to the presence and absence of the suction nozzle.
Figure 11B:
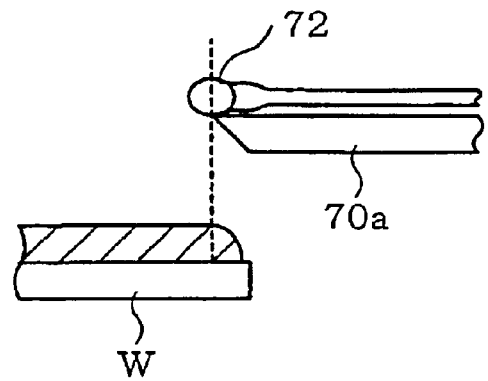

As in this embodiment, the resist solution is applied while the nozzle 65 is moved, and the resist solution discharged from the nozzle 65 to the peripheral portion of the wafer W is sucked by the suction nozzles 72 and 73. Consequently, as shown in FIGS. 11A and 11B, it is possible to reduce the amount of application to the peripheral portion of the wafer W to restrain protuberance of the resist solution at the peripheral portion of the wafer W caused by surface tension. Accordingly, the problem feared in the method of applying the resist solution in the manner of the so-called single stroke is solved, with the result that parts where the resist film has a predetermined film thickness increase and the region of the wafer W capable of being used as products increases correspondingly in area to improve yields.

Figure 12:
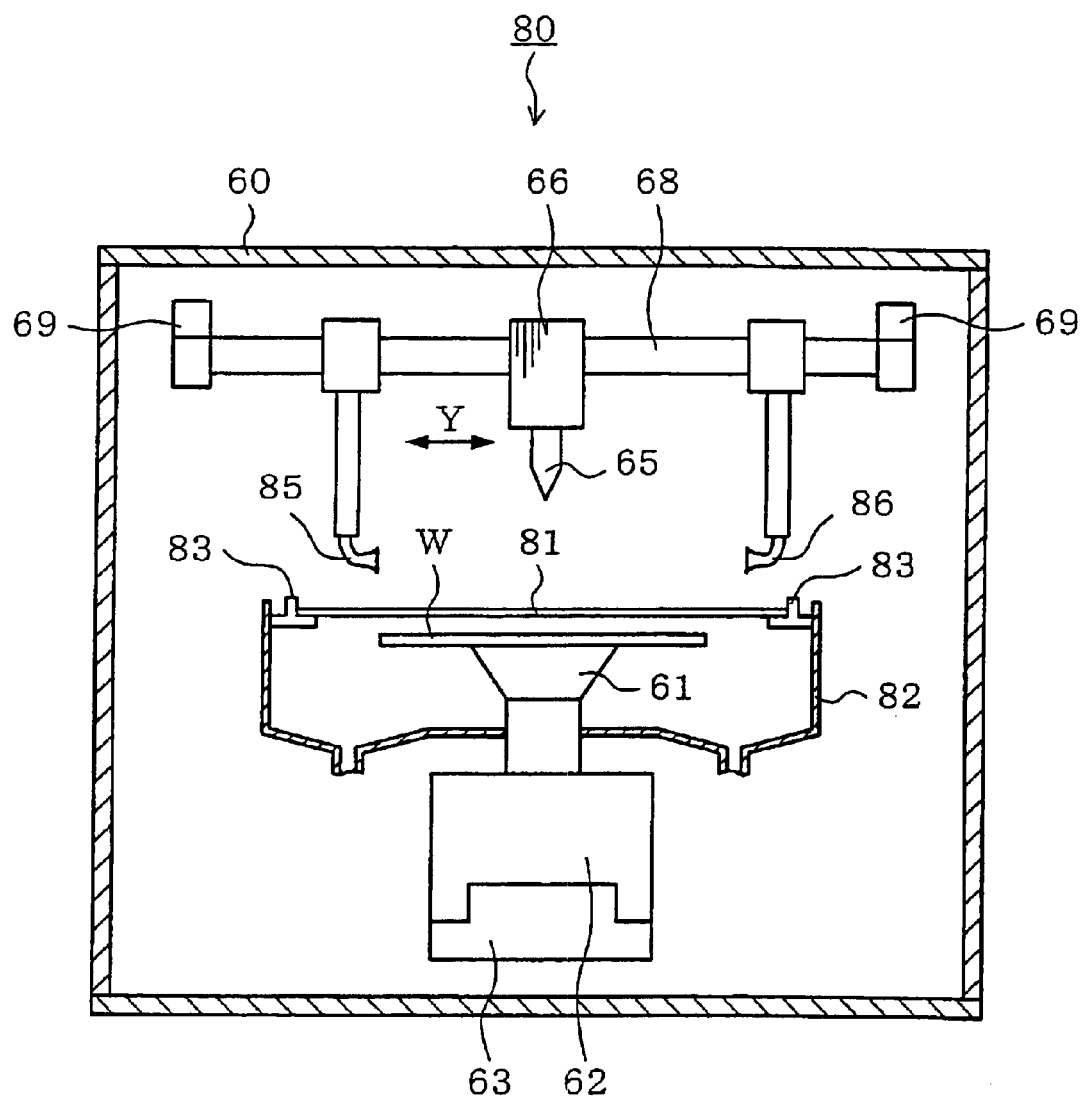
FIG. 12 is an explanatory view of a vertical cross section of a resist coating unit in the case of a different mask member being used.
Figure 13:
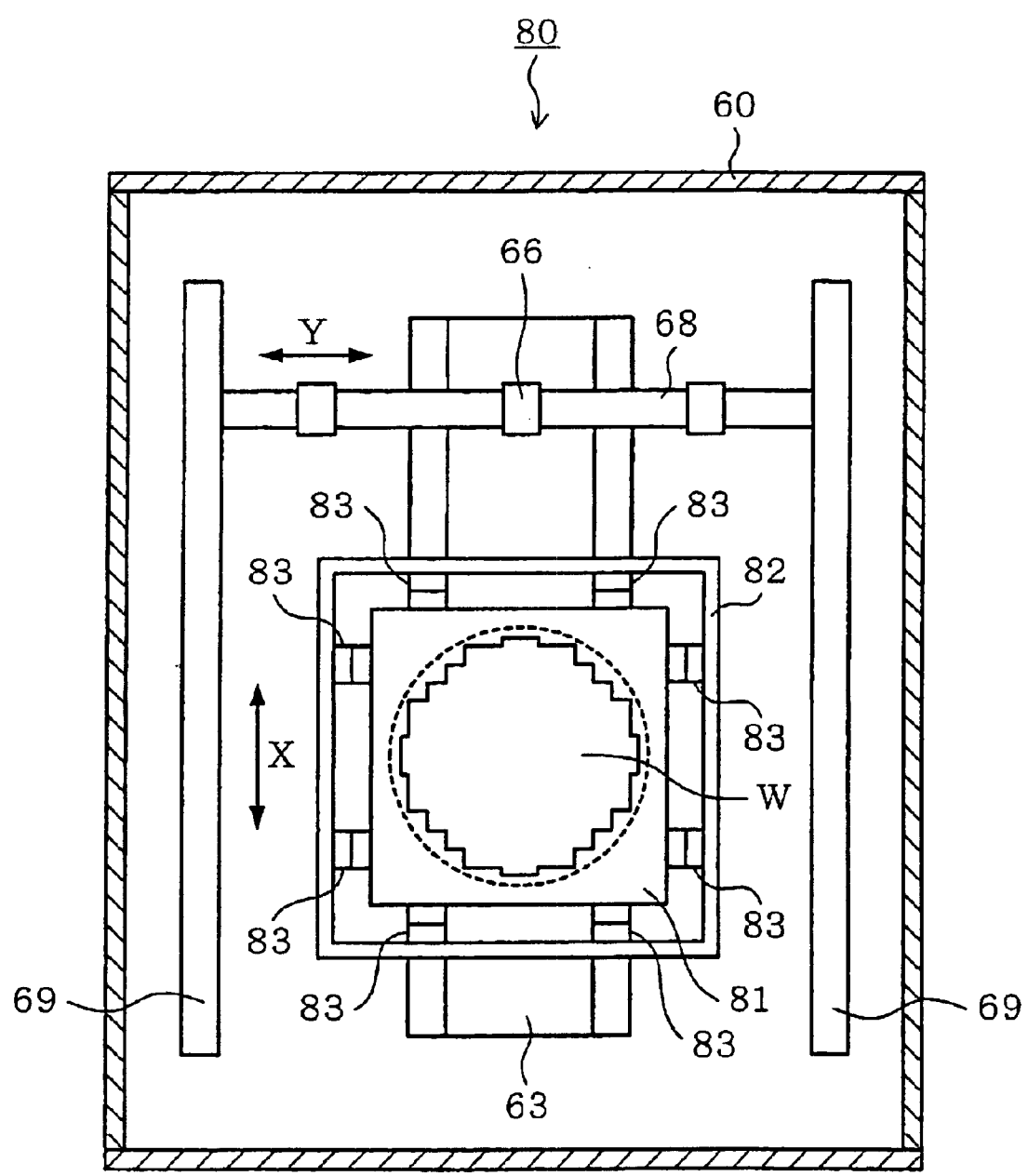
FIG. 13 is an explanatory view of a horizontal cross section of the resist coating unit in the case of the different mask member being used.

In place of the aforesaid mask members 70 and 71, a mask member 81, which has the shape of a square plate and opens corresponding to the coating area of the wafer W may be used here. The resist coating unit 80 in this case is configured, as shown in FIGS. 12 and 13, such that the mask member 81 is supported by supporting members 83 provided inside a square cup 82 in parallel with the upper face of the wafer W. Further, suction nozzles 85 and 86 are attached to the rail 68 to be movable, and the tips thereof are located above the peripheral portions of the wafer W and below the nozzle 65. As in the aforesaid first embodiment, the suction nozzles 85 and 86 are always located above the peripheral portion of the wafer W and suck the resist solution discharged from the nozzle 65 at predetermined timing. As a result, the amount of application of the resist solution to the peripheral portion of the wafer W can be reduced to half, thereby restraining protuberance of the resist solution occurring at the peripheral portion of the wafer W.

Figure 14:
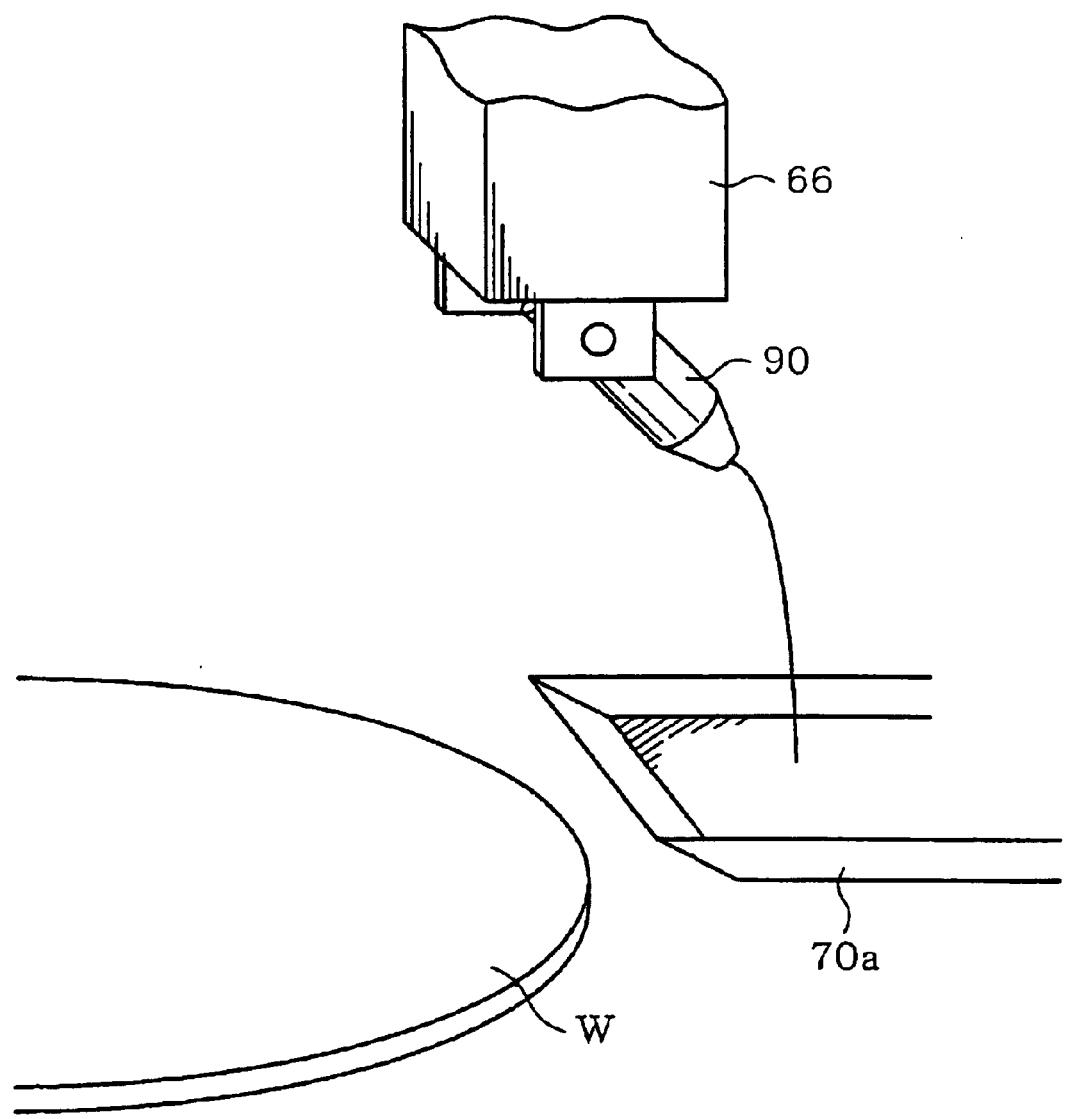
FIG. 14 is an explanatory view of another embodiment including a nozzle capable of changing its discharge direction.

In the aforesaid embodiment, the discharge amount is adjusted by sucking the resist solution discharged from the nozzle 65 by means of the suction nozzle 72 or the like, but the adjustment may be made by changing the direction of the nozzle itself. In other words, as shown in FIG. 14, the direction of a nozzle 90 for discharging the resist solution may be made changeable as a device for reducing the amount of application of the resist solution to the peripheral portion of the wafer W. In this case, the nozzle 90 moves as has been described in the first embodiment and is directed to the outside of the wafer W as shown in FIG. 14 when the nozzle 90 passes above the peripheral portion of the wafer W to thereby reduce the amount of application to the peripheral portion of the wafer W. Here, it can be proposed that the timing of changing the direction of the nozzle 90 is set, for example, on one of the forward path and the return path as in the first embodiment. This can reduce by half the amount of application to the peripheral portion of the wafer W to thereby restrain protuberance of the resist solution at the peripheral portion of the wafer W as in the aforesaid embodiments.

Figure 15:
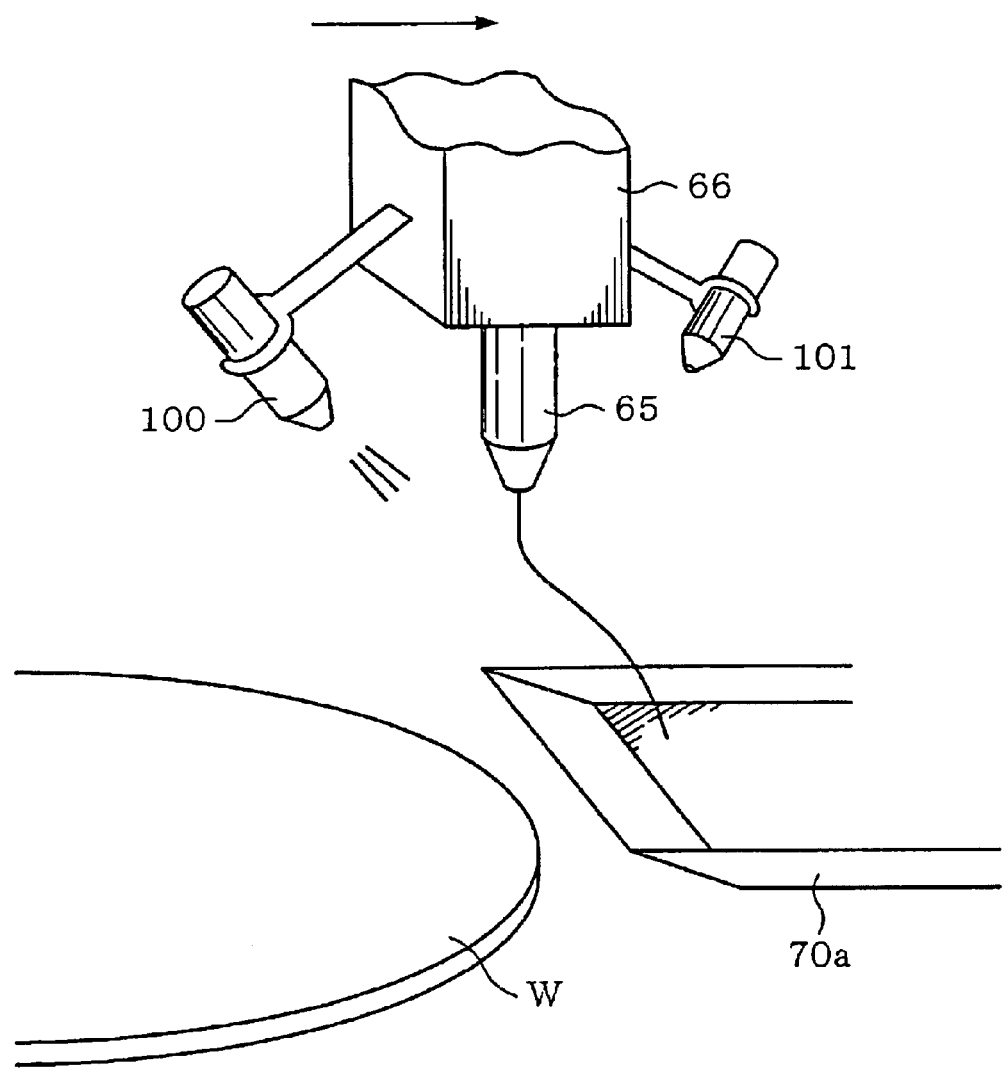
FIG. 15 is an explanatory view of another embodiment in which a gas supply nozzle is attached to a nozzle.

Moreover, as another embodiment, it is also suitable that, for example, nitrogen gas, another inert gas, or the like is blown to the resist solution discharged from the nozzle 65 to blow the resist solution off the wafer W, thereby reducing the amount of application of the resist solution to the peripheral portion of the wafer W. For example, as shown in FIG. 15, two gas supply nozzles 100 and 101 each for supplying nitrogen gas are arranged with the nozzle 65 interposed therebetween on the same X coordinate. When the nozzle 65 moves from the inside to the outside of the wafer W as shown by the arrow in FIG. 15, gas is blown from the gas supply nozzle 100 to blow the resist solution discharged from the nozzle 65 off to the outside, thereby reducing the amount of application. Further, when the nozzle 65 moves in the opposite direction, the resist solution is blown off by the gas supply nozzle 101 to reduce the amount of application. The timing of blowing gas to the resist solution may be set at the time when the nozzle 65 passes above the peripheral portion of the wafer W on the forward path or the return path as in the first embodiment. This reduces the amount of application to the peripheral portion of the wafer W to thereby restrain protuberance of the resist solution at the peripheral portion of the wafer W caused by surface tension.

The previously described embodiments are on the resist film forming apparatus for the wafer in the photolithography process in the semiconductor wafer device fabrication processes, but the present invention is also applicable to a film forming apparatus for a substrate other than the semiconductor wafer, for example, an LCD substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of forming a film of a coating solution on a substrate through the use of a coating solution discharge member, comprising the steps of:

moving the coating solution discharge member relative to the substrate while the coating solution is being discharged from the coating solution discharge member to a surface of the substrate; and changing a discharge direction of the coating solution to an outer peripheral portion of the substrate to make an amount of application to the outer peripheral portion smaller than that to other portions.

2. The method according to claim 1, wherein before the coating solution discharged by the coating solution discharge member reaches the substrate, the coating solution is sucked to change the discharge direction of the coating solution.

3. The method according to claim 1, wherein a direction of the coating solution discharge member itself is changed to change the discharge direction.

4. The method according to claim 1, wherein before the coating solution discharged by the coating solution discharge member reaches the substrate, a predetermined gas is blown to the coating solution to change the discharge direction of the coating solution.

5. The method according to claim 1, wherein said step of relatively moving is a step of reciprocating the coating solution discharge member above the substrate across the outer peripheral portion of the substrate while the coating solution is being discharged to the substrate, and wherein only when the coating solution discharge member moves from an inside to an outside of the substrate while discharging the coating solution to the substrate to thereby cross the outer peripheral portion of the substrate, the discharge direction of the coating solution is changed.

6. The method according to claim 5, wherein before the coating solution discharged by the coating solution discharge member reaches the substrate, the coating solution is sucked to change the discharge direction of the coating solution.

7. The method according to claim 5, wherein a direction of the coating solution discharge member itself is changed to change the discharge direction.

8. The method according to claim 5, wherein before the coating solution discharged by the coating solution discharge member reaches the substrate, a predetermined gas is blown to the coating solution to change the discharge direction of the coating solution.

9. The method according to claim 3, wherein said step of relatively moving is a step of reciprocating the coating solution discharge member above the substrate across the outer peripheral portion of the substrate while the coating solution is being discharged to the substrate, and wherein only when the coating solution discharge member moves from an outside to an inside of the substrate while discharging the coating solution to the substrate to thereby cross the outer peripheral portion of the substrate, the discharge direction of the coating solution is changed.

10. The method according to claim 9, wherein before the coating solution discharged by the coating solution discharge member reaches the substrate, the coating solution is sucked to change the discharge direction of the coating solution.

11. The method according to claim 9, wherein a direction of the coating solution discharge member itself is changed to change the discharge direction.

12. The method according to claim 9, wherein before the coating solution discharged by the coating solution discharge member reaches the substrate, a predetermined gas is blown to the coating solution to change the discharge direction of the coating solution.

\* \* \* \* \*